(12) United States Patent
Yavoich et al.

(10) Patent No.: US 11,067,627 B2
(45) Date of Patent: Jul. 20, 2021

(54) NOISE INJECTION CIRCUIT

(71) Applicant: INTERNATIONAL BUSINESS MACHINES CORPORATION, Armonk, NY (US)

(72) Inventors: Brian James Yavoich, Highland, NY (US); John Davis, Wallkill, NY (US); Paul Alan Bunce, Poughkeepsie, NY (US); Russell Hayes, New Paltz, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 131 days.

(21) Appl. No.: 16/562,581

(22) Filed: Sep. 6, 2019

(65) Prior Publication Data

US 2021/0072313 A1    Mar. 11, 2021

(51) Int. Cl.
*G01R 31/00* (2006.01)
*G01R 31/317* (2006.01)

(52) U.S. Cl.
CPC .............. *G01R 31/31709* (2013.01)

(58) Field of Classification Search
USPC ........................ 324/613; 703/14–16
See application file for complete search history.

(56) References Cited

U.S. PATENT DOCUMENTS

| 2005/0169185 | A1 | 8/2005 | Qiu |
| 2006/0181287 | A1* | 8/2006 | Motohashi ........ G01R 31/002 324/613 |
| 2009/0192777 | A1 | 7/2009 | Clement |
| 2013/0110487 | A1 | 5/2013 | Mostow |

OTHER PUBLICATIONS

Transmittal Form PTO/SB/21, filed Mar. 18, 2020.

* cited by examiner

*Primary Examiner* — Vincent Q Nguyen
(74) *Attorney, Agent, or Firm* — Cantor Colburn LLP; William Kinnaman

(57) ABSTRACT

A method for testing a circuit includes receiving, by a noise injection circuit, an input signal and generating a noise pulse. Generating the noise pulse includes computing an input resistor pulse, and computing an output resistor pulse. Generating the noise pulse further includes short-circuiting an output resistor substantially simultaneously with opening an input resistor. The method for testing the circuit includes modifying, by the noise injection circuit, the input signal using the noise pulse.

20 Claims, 5 Drawing Sheets

NOISE INJECTION CIRCUIT

BACKGROUND

The present invention generally relates to electrical circuits and particularly to a circuit that can inject a programmable noise.

The number of noise sources in a printed circuit board has increased due to various reasons, such as increased operation speeds, a higher density of the circuits, etc. Testing such electrical circuits for identification of the source of noise is technically challenging. Testing a design of an electrical circuit can be difficult without consistent inputs to an electrical circuit, often referred to as the system under test (SUT).

SUMMARY

According to one or more embodiments of the present invention, a method for testing a circuit includes receiving, by a noise injection circuit, an input signal and generating a noise pulse. Generating the noise pulse includes computing an input resistor pulse, and computing an output resistor pulse. Generating the noise pulse further includes short-circuiting an output resistor substantially simultaneously with opening an input resistor. The method for testing the circuit includes modifying, by the noise injection circuit, the input signal using the noise pulse.

According to one or more embodiments of the present invention, a system includes a system under test, and a noise injection circuit coupled with the system under test. The noise injection circuit performs a method for testing the system under test. The method includes receiving an input signal being input to the system under test. The method further includes generating a noise pulse. Generating the noise pulse includes computing an input resistor pulse, and computing an output resistor pulse. Generating the noise pulse further includes short-circuiting an output resistor substantially simultaneously with opening an input resistor. The method for testing the circuit includes modifying, by the noise injection circuit, the input signal using the noise pulse.

A computer program product comprising a computer-readable storage media having computer-executable instructions stored thereupon, which when executed by a processor cause the processor to perform a method of simulating a noise injection circuit. The method includes receiving an input signal being input to the system under test. The method further includes generating a noise pulse. Generating the noise pulse includes computing an input resistor pulse, and computing an output resistor pulse. Generating the noise pulse further includes short-circuiting an output resistor substantially simultaneously with opening an input resistor. The method for testing the circuit includes modifying, by the noise injection circuit, the input signal using the noise pulse.

The above-described features can also be provided at least by a system, a computer program product, and a machine, among other types of implementations.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describe having a communications path between two elements and does not imply a direct connection between the elements with no intervening elements/connections between them. All of these variations are considered a part of the specification.

DETAILED DESCRIPTION

Embodiments of the present invention facilitate testing electrical circuits that can include analog and digital components. The electrical circuits can be integrated circuits (ICs) on a single silicon block or on several silicon substrates in the same package as well as assemblies of components (whether integrated or not) on a printed circuit.

The design of an electrical circuit is tested prior to manufacturing the electrical circuit. A technical challenge during the testing of the design of the electrical circuit, which can be referred to as the system under test (SUT), is controlling operating parameters consistently. Particularly, embodiments of the present invention, address the technical challenge of controlling the creation of a noise pulse in a consistent manner, where the noise pulse is to be input to the SUT without introducing a load on the SUT. The creation of the noise pulse by one or more embodiments of the present invention is not affected by variations in the design of the SUT in a simulation environment.

Existing technical solutions to such technical problems use n-channel field-effect transistor (NFET) pulldown with gate tied to a noise source to create the noise pulse. However, in such solutions, the induced voltage varies with process corners. Other existing solutions for creating noise pulses add loads to the SUT. The term "noise" is understood to mean any signal generated by a circuit element which has an undesired effect on another circuit element.

Simulation products, such as a simulation program with integrated circuit emphasis (SPICE), are used to analyze the effects of noise pulses on an electrical element (or circuit). However, for electrical circuits that include several millions of transistors or logic gates, which is typical when the circuits include integrated circuits (ICs), the simulation models require an excessive amount of system resources.

Hence, approximate models of the electrical circuits are used and a simulated noise pulse is injected into such models.

Embodiments of the present invention facilitate generating and injecting an arbitrary voltage offset on any given node of an electrical circuit to simulate the node voltage being shifted by some arbitrary noise source by using a current source to track a voltage.

Figure 1:
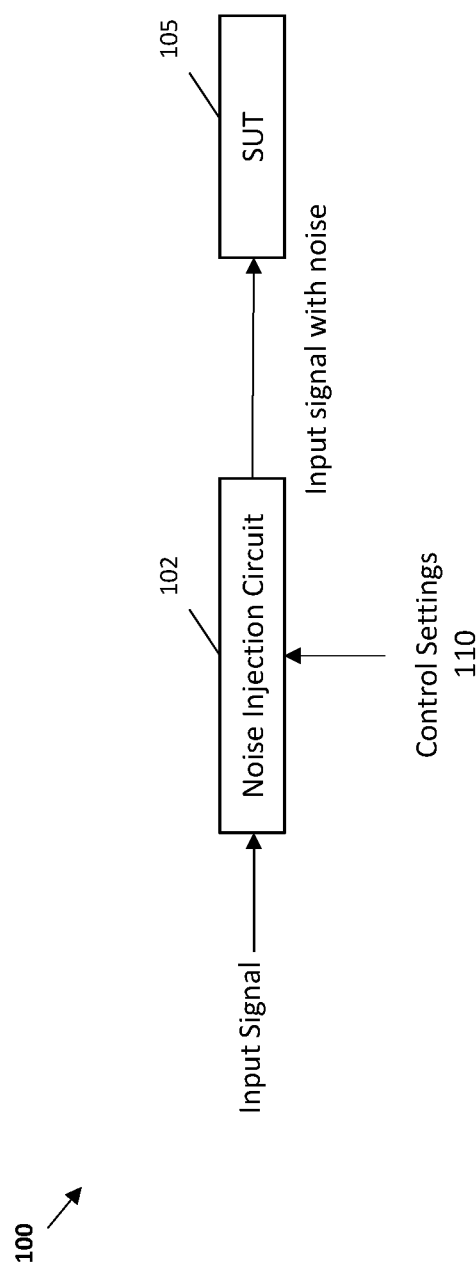
FIG. 1 depicts a block diagram of an electrical circuit testing system according to one or more embodiments of the present invention.

FIG. 1 depicts a block diagram of an electrical circuit testing system according to one or more embodiments of the present invention. The testing system 100 includes a SUT 105 that is being supplied with an input signal. A noise injection circuit 102 interjects the input signal and modifies the input signal by adding a noise pulse to the input signal. The noise added input signal is then received by the SUT 105. The noise injection circuit 102 generates the noise pulse according to control settings 110. The control settings 110 are configurable.

Figure 2:
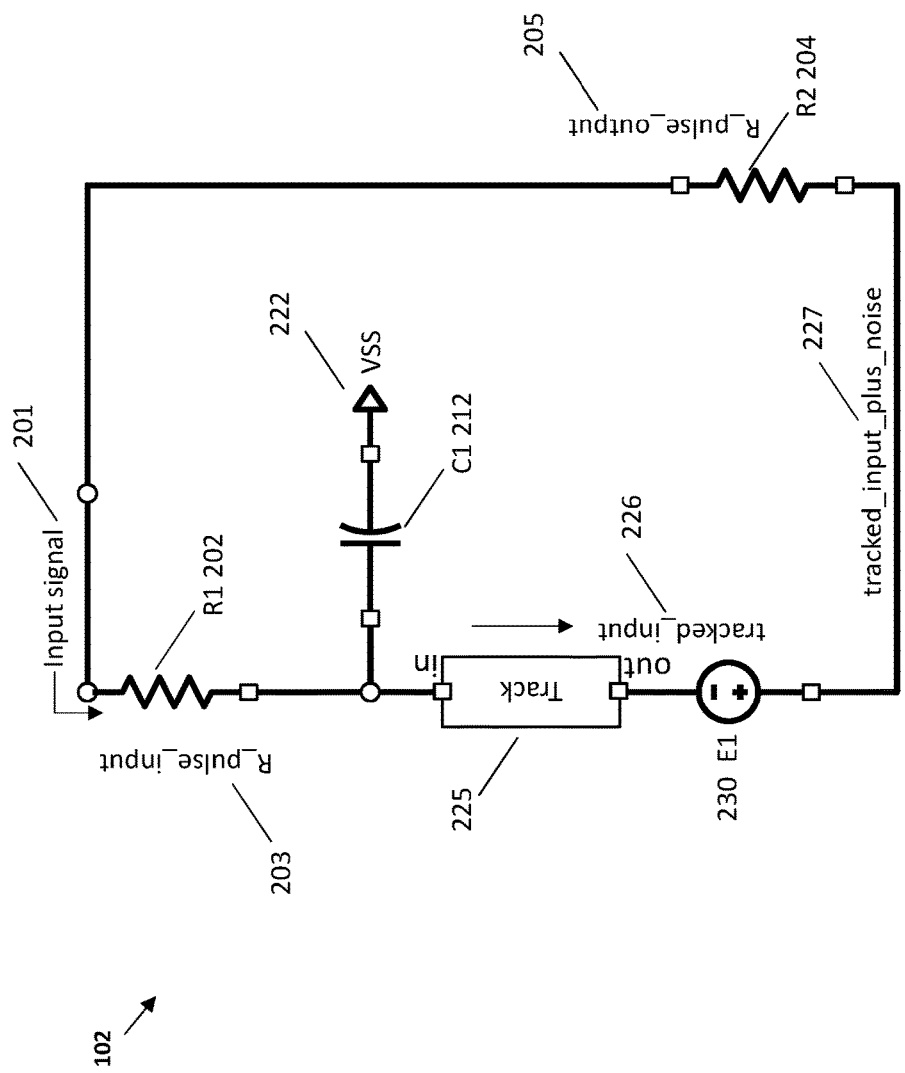
FIG. 2 depicts a block diagram of a noise injection circuit according to one or more embodiments of the present invention.

FIG. 2 depicts a block diagram of a noise injection circuit according to one or more embodiments of the present invention. The noise injection circuit 102 includes two resistors, R1 202 and R2 204 for injecting noise. In a simulated testing environment, the resistors are simulated variable resistors. R1 202 can be referred to as an input resistor and R2 204 can be referred to as an output resistor.

The noise injection circuit 102 also includes a capacitor C1 212. The capacitor 212 is in series with a voltage source 222. Capacitor 212 is used to hold the voltage on the node after R1 202 when R1 202 is opened.

A power source 230 in the noise injection circuit 102 causes a voltage shifting. In one or more embodiments of the present invention, the power source 230 provides a direct current (DC) voltage shift. In other embodiments of the present invention, the power source 230 can provide an AC signal.

The noise injection circuit 102 also includes a voltage mirror 225. A voltage mirror is a circuit element that copies the voltage at the input terminal and applies it across the output terminal. It applies no load to the input terminal, and the output voltage is the same as the input voltage regardless of output load. The input signal 201 is input to the voltage mirror 225 and a tracked input 226 is output, where the tracked input 226 has the same shape and voltage as the input signal 201. A noise pulse is added to the tracked input 226 as a result of the voltage change provided by the power source 230. The resulting signal is depicted as "tracked input plus noise" 227. The tracked input plus noise signal 227 is provided to the SUT 105.

Figure 3:
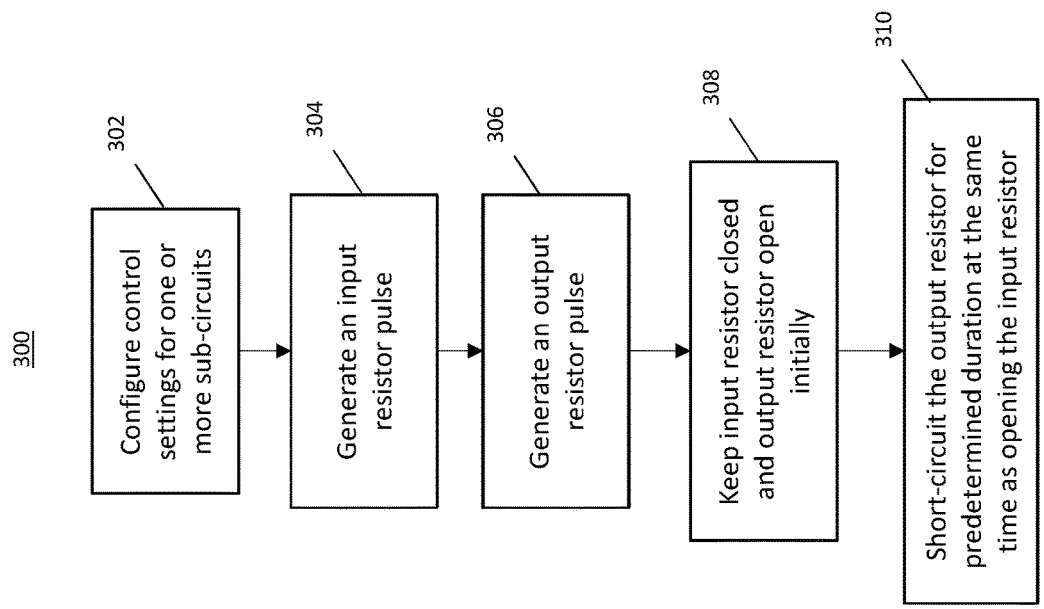
FIG. 3 depicts a flowchart of a method of operation of the noise injection circuit according to one or more embodiments of the present invention.

FIG. 3 depicts a flowchart of a method 300 of operation of the noise injection circuit according to one or more embodiments of the present invention.

The method 300 includes setting the control settings 110 of the noise injection circuit 110, at block 302. The control settings 110 can determine values of the resistors, capacitors, and other parameters associated with the noise injection circuit 102. For example, the control settings 110 can include parameters, which can have sample values as follows: Fall=30 picoseconds, Rise=10 picoseconds, Width=100 picoseconds, R_max=1e9 Ohms, R_min=1e-9 Ohms, etc.

In one or more examples, the control settings 110 indicate a delay, since the start of an input signal, when a noise pulse is to be injected. Further, the control settings 110 can include parameters that define the noise pulse, such as rise, fall, and width for which to apply the noise pulse. Further yet, the control settings 110 provide a low value, a high value, and other such settings that facilitate dynamically and programmatically adjusting the noise pulse being generated.

Figure 4:
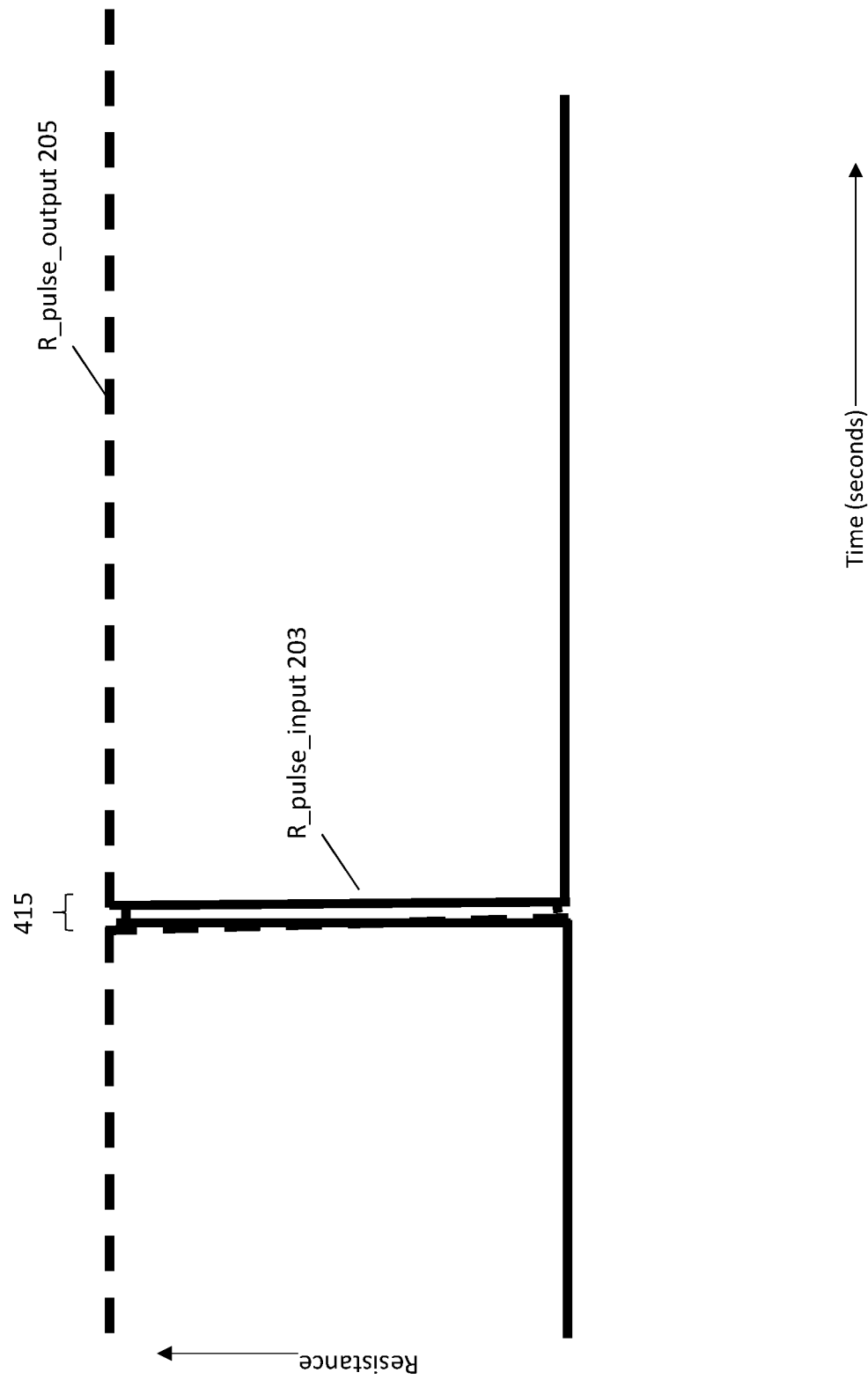
FIG. 4 depicts an input resistor pulse and an output resistor pulse according to one or more embodiments of the present invention.

Further, in the method 300 shown in FIG. 3, an input resistor pulse 203 is generated, at block 304. The input resistor pulse 203 is defined programmatically. In one or more examples, the input resistor pulse 203 can be based on an input pulse (R_Pulse_In). An example configuration of the input resistor pulse 203 is: R_Pulse_input=R_Pulse_in*R_max. The input pulse can be a predetermined pulse waveform. Alternatively, or in addition, the method includes setting an input pulse programmatically. For example, the input pulse can be configured using one or more parameters from the control settings 110. For example, the input pulse can be: R_Pulse_in=perpulse (401p+1.0*Rise+0.05p, 0.2p, 0.2p, 0.5*Rise+0.5*Fall-9p, 1000*Width, R_min, 0.999999999). (p=picoseconds). FIG. 4 depicts the input resistor pulse 203 according to one or more embodiments of the present invention.

Similarly, an output resistor pulse 205 is generated, at block 306. The output resistor pulse 205 is defined programmatically. In one or more examples, the output resistor pulse 205 can be based on a pulse waveform (R_Pulse). An example definition of the output resistor pulse 205 is: R_Pulse_output=R_Pulse*R_max. The output pulse can be a predetermined pulse waveform. Alternatively, or in addition, the method includes setting an output pulse programmatically. For example, the resistor pulse can be defined programmatically using the control settings 110. For example, R_Pulse=1−perpulse(401p+1.0*Rise-0.13p, 0.2p, 0.2p, 1.2p, 1000*Width, R_min, 0.999999999). FIG. 4 depicts the output resistor pulse 205 according to one or more embodiments of the present invention.

The method includes keeping input resistor R1 202 closed (short-circuited/small resistance value, e.g., below a first predetermined threshold), and the output resistor R2 204 open (large resistance value, e.g., above a second predetermined threshold) as the input signal 201 is started to be received, at block 308. Here, keeping R2 204 as an "open resistor" causes the noise injection circuit 102 to be isolated from the input signal 201 and hence, does not change the input signal 201.

The output resistor 204 is short-circuited, very briefly (e.g., ~1 picosecond (ps)), for a predetermined duration and at the same time the input resistor 202 opens, at block 310. A simulation of this condition is depicted in FIG. 4, where, for the duration 415, the output resistor 204 is short-circuited at the same time as the input resistor 202 opens. The noise pulse is generated during this duration 415 that gets added into the tracked input signal 226. As depicted in FIG. 4, the input resistor pulse 203 and the output resistor pulse 205 are overlapping pulses, where one is rising while the other is falling, and is falling while the other is rising.

Upon opening the output resistor 204 again, the tracked input signal 226 resumes behavior with a voltage step drop caused by the power source 230.

Figure 5:
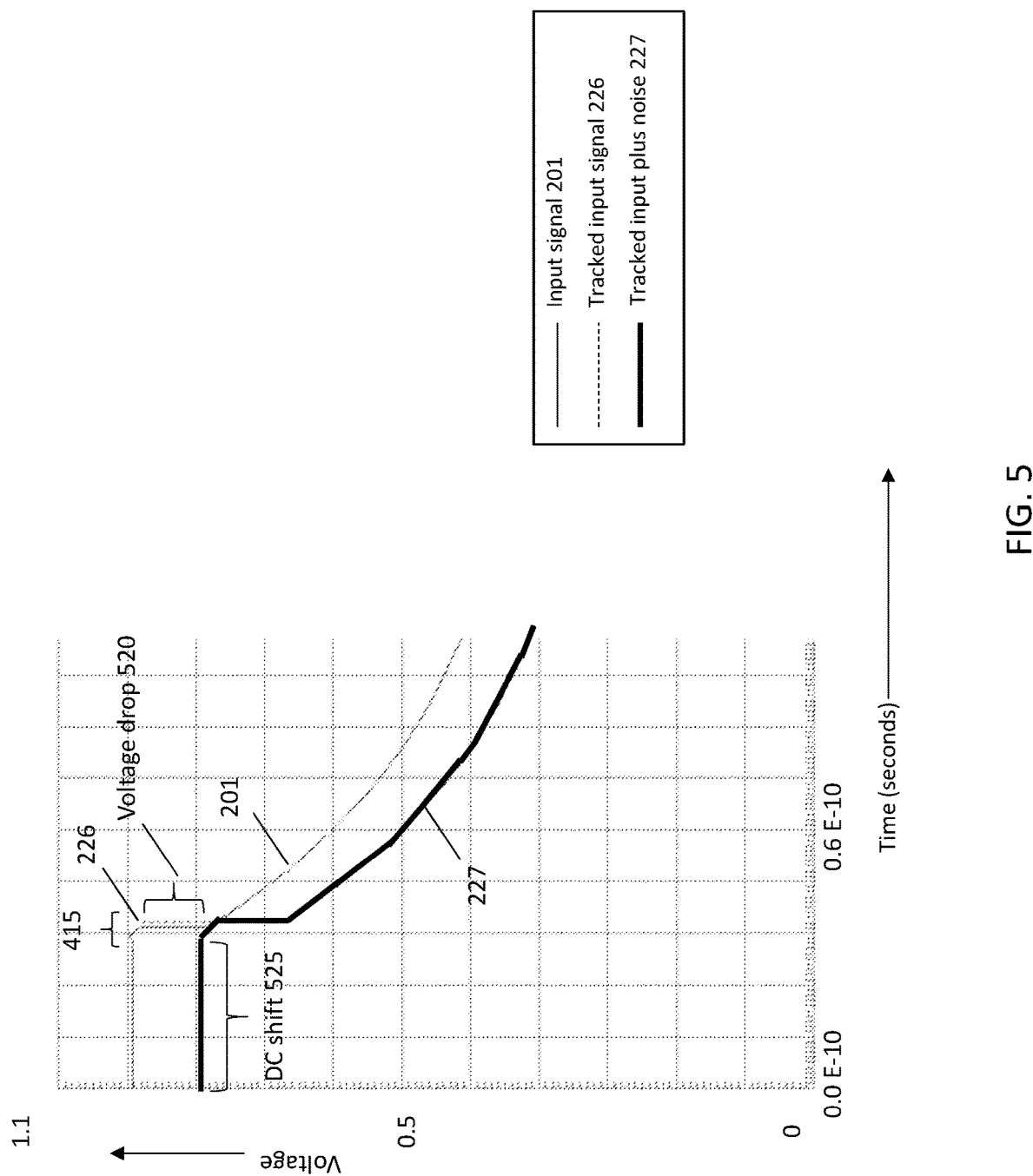
FIG. 5 depicts a visualization of the example operation of the noise injection circuit according to one or more embodiments of the present invention.

FIG. 5 depicts a visualization of the example operation of the noise injection circuit according to one or more embodiments of the present invention. Here, the input signal 201 is shown that is affected by a noise pulse, i.e., the voltage drop 520 that results in the tracked input plus noise 227 that is received by the SUT 105. The voltage drop 520 is generated when the input resistor 202 is opened and the output resistor 204 is short-circuited, substantially simultaneously, as described herein. As can be seen, the input signal 201 is changed by the noise pulse only by the voltage drop 520 (100 millivolts (mV) in this case), however, the shape of the tracked input plus noise 227 stays substantially the same (i.e., does not change) as that of the input signal 201 (or the tracked input signal 226). Upon opening the output resistor 204, the tracked input signal 226 resumes behavior (i.e., maintains shape) similar to the input signal 201 with the voltage step drop 520.

When the input resistor 202 is closed, the noise injection circuit 102 tracks the input signal 201 with the DC shift caused by the power source 230. Accordingly, a DC shifted tracking 525 is also caused by the noise injection circuit. The shape of the input signal 201 shifts down by 100 mV in the depicted example at the time the input resistor 202 is opened and the output resistor 204 is closed for the predetermined duration 415. The 100 mV voltage drop is caused by the power source 230 and is an example voltage drop described herein. It is understood that in other embodiments of the present invention, the shifting can be different based on different control settings 110 used.

It is understood that the particular parameter values and results depicted herein are just examples and that in one or more embodiments of the present invention other parameter values and other results are possible. Further, the examples herein describe a voltage drop 520 used as the noise pulse, however, in one or more embodiments of the present invention, the noise pulse can be a rise in the voltage level of the input signal 201.

In one or more examples, the noise injection circuit 102 can be part of the SUT 105, such as a memory chip, e.g. random memory access (RAM) module, cache module, or any other such memory chip. The noise injection can be performed on a local bit line in the memory chip.

The simulation is used for testing the SUT 105, for example, performing statistical analysis and noise reliability. According to one or more embodiments of the present invention, by providing a known input signal value 201, and a programmatically configured, i.e., known, noise pulse, the output of the SUT 105 can be compared with an expected result to test the operation of the SUT 105. Additionally, by dynamically configuring the noise pulse with a given input signal 201, different conditions regarding the SUT 105 can be made, such as, the noise pulse value at which the result of the SUT 105 deteriorates, or the range of noise pulse that the SUT 105 can sustain. It is understood that the noise injection circuit 102 can be used for various other analysis and testing of the SUT 105.

One or more embodiments of the present invention facilitate using simulated variable resistors, a voltage mirror, a DC voltage shift for injecting noise and an output resistor and capacitor that holds the voltage level. An input resistor starts open, and the output is closed. The output resistor is short-circuited, very briefly at the same time the input resistor is opened. The resulting noise pulse is used to modify an input signal that is being sent to a SUT. In one or more embodiments of the present invention, the simulation is used for testing—statistical analysis and noise reliability. The simulation results in no introduction of load or device variation and provides consistent noise input for such statistical analysis. Accordingly, one or more embodiments of the present invention facilitate a practical application of generating a noise pulse that can be used to modify an input signal to be used to test a SUT.

The present invention may be a system, a method, and/or a computer program product at any possible technical detail level of integration. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, configuration data for integrated circuitry, or either source-code or object code written in any combination of one or more programming languages, including an object-oriented programming language such as Smalltalk, C++, or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instruction by utilizing state information of the computer-readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other devices to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

What is claimed is:

1. A method for testing a circuit, the method comprising:
   receiving, by a noise injection circuit, an input signal;
   generating a noise pulse, the generating comprising:
      computing an input resistor pulse;
      computing an output resistor pulse; and
      short-circuiting an output resistor substantially simultaneously with opening an input resistor; and
      modifying, by the noise injection circuit, the input signal using the noise pulse.

2. The method of claim 1, wherein the noise injection circuit comprises a voltage mirror that provides a tracked input signal.

3. The method of claim 2, wherein the noise pulse causes a voltage change in the tracked input signal without a change in the shape, the shape staying the same as the shape of the input signal.

4. The method of claim 1, wherein the output resistor is short-circuited for a predetermined duration at substantially the same time as the input resistor is opened.

5. The method of claim 4, wherein the input resistor is kept open for a longer duration than the predetermined duration.

6. The method of claim 1, wherein the noise injection circuit further comprises a capacitor in series with a voltage source.

7. The method of claim 1, wherein the noise injection circuit further comprises a power source that generates the noise pulse as a voltage drop of a predetermined value.

8. A system comprising:
a system under test; and
a noise injection circuit coupled with the system under test, wherein the noise injection circuit performs a method comprising:
receiving an input signal being input to the system under test; and
generating a noise pulse, the generating comprises:
computing an input resistor pulse;
computing an output resistor pulse; and
short-circuiting an output resistor substantially simultaneously with opening an input resistor; and
modifying, by the noise injection circuit, the input signal using the noise pulse.

9. The system of claim 8, wherein the noise injection circuit comprises a voltage mirror that provides a tracked input signal.

10. The system of claim 9, wherein the noise injection circuit further comprises a power source that generates the noise pulse as a voltage drop of a predetermined value.

11. The system of claim 10, wherein the noise pulse causes a voltage change in the tracked input signal without a change in the shape, the shape staying the same as the shape of the input signal.

12. The system of claim 8, wherein the output resistor is short-circuited for a predetermined duration at substantially the same time as the input resistor is opened.

13. The system of claim 12, wherein the input resistor is kept open for a longer duration than the predetermined duration.

14. The system of claim 8, wherein the noise injection circuit further comprises a capacitor in series with a voltage source.

15. A computer program product comprising a computer-readable storage media having computer-executable instructions stored thereupon, which when executed by a processor cause the processor to perform a method of simulating a noise injection circuit, the method comprising:
receiving an input signal being input to a system under test; and
generating a noise pulse, the generating comprises:
computing an input resistor pulse;
computing an output resistor pulse; and
short-circuiting an output resistor substantially simultaneously with opening an input resistor; and
modifying, by the noise injection circuit, the input signal using the noise pulse.

16. The computer program product of claim 15, wherein the noise injection circuit comprises a voltage mirror that provides a tracked input signal.

17. The computer program product of claim 16, wherein the noise injection circuit further comprises a power source that generates the noise pulse as a voltage drop of a predetermined value, wherein the noise pulse causes a voltage change in the tracked input signal without a change in the shape, the shape staying the same as the shape of the input signal.

18. The computer program product of claim 15, wherein the output resistor is short-circuited for a predetermined duration at substantially the same time as the input resistor is opened.

19. The computer program product of claim 18, wherein the input resistor is kept open for a longer duration than the predetermined duration.

20. The computer program product of claim 15, wherein the noise injection circuit further comprises a capacitor in series with a voltage source.

\* \* \* \* \*